US006566728B1

(12) United States Patent
Okawa et al.

(10) Patent No.: US 6,566,728 B1
(45) Date of Patent: May 20, 2003

(54) SEMICONDUCTOR DEVICE

(75) Inventors: Shigeaki Okawa, Tochigi (JP); Toshiyuki Ohkoda, Gunma (JP); Yoshiaki Ohbayashi, Nara (JP); Mamoru Yasuda, Osaka (JP); Shinichi Saeki, Osaka (JP); Shuji Osawa, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/678,555

(22) Filed: Oct. 4, 2000

(30) Foreign Application Priority Data

Oct. 4, 1999 (JP) .......................................... 11-282542

(51) Int. Cl.[7] .............................................. H01L 29/00

(52) U.S. Cl. ....................... 257/528; 381/113; 437/225; 73/724

(58) Field of Search .......................... 257/528; 437/225, 437/901; 73/724; 367/163; 381/113

(56) References Cited

U.S. PATENT DOCUMENTS 5,321,989 A * 6/1994 Zimmer et al. ............... 73/724
5,470,797 A * 11/1995 Mastrangelo ............... 437/225
6,308,398 B1 * 10/2001 Beavers ....................... 29/594

FOREIGN PATENT DOCUMENTS

JP Hei. 11-88992 3/1999
JP 112095 * 4/2001 ........... H01L/29/84

* cited by examiner

*Primary Examiner*—Tom Thomas
*Assistant Examiner*—Ori Nadav
(74) *Attorney, Agent, or Firm*—Fish & Richardson P.C.

(57) ABSTRACT

First, a stationary electrode layer is formed over a semiconductor substrate and an integrated network is composed in a circuit element area around the stationary electrode layer by electrode wiring forming each circuit element. A spacer is arranged on a passivation film in plural places. A dummy island is formed in an area between the circuit element area and the stationary electrode layer area. Supply potential Vcc is applied to the dummy island and ground potential GND is applied to a $P^+$-type separated area.

13 Claims, 4 Drawing Sheets

- PRIOR ART -

SEMICONDUCTOR DEVICE

BACKGROUND OF THE INVENTION

The present invention relates to a semiconductor device used for an electrostatic microphone and others.

Multiple electret capacitor microphones (hereinafter called ECM) which can be easily miniaturized are used for a mobile telephone. Technique for configuring a capacitor on a semiconductor substrate where integrated circuits such as an amplifier are configured to realize the further miniaturization is disclosed in Japanese Patent Publication No. 11-88992 for example. To detailedly describe the technique, a stationary electrode layer is formed on a semiconductor substrate, a vibrating diaphragm is attached over the stationary electrode layer via a spacer and a capacitor is composed by the stationary electrode layer and the vibrating diaphragm.

FIG. 4 shows the structure. A stationary electrode layer 112, an insulating film 113, a spacer 114 and a vibrating diaphragm 115 are sequentially laminated on the surface of a silicon semiconductor substrate 111 and the lamination is installed in a package 118 having a hole 116. A reference number 117 denotes cloth and it is provided if necessary. A junction-type FET for impedance conversion, further an amplifier and a noise canceling circuit and others are integrated on the surface of the semiconductor substrate 111 according to a normal semiconductor process. The capacitance value of a capacitor formed by the vibrating diaphragm 115 and stationary electrode layer 112 varies because aerial vibration vibrates the vibrating diaphragm 115, the variation of the capacitance value is input to the FET and the FET converts it to an electric signal.

However, the capacitor microphone cannot be housed in a complete sealed container because of its property. Structure that aerial vibration can reach the vibrating diaphragm 115 via the hole 116 is necessarily required. The maintenance of a state in which aerial vibration is enabled means that it is also impossible to completely intercept light.

At least a few circuit elements integrated in the semiconductor substrate 111 are composed of PN junction. When light is incident on such a silicon semiconductor substrate having PN junction, dark current is caused by photoelectromotive force. There is a defect that the caused dark current flows in the circuit element, noise is caused and the malfunction of the circuit is caused.

SUMMARY OF THE INVENTION

The present invention is made to solve the problem described above.

According to first aspect of the invention, a semiconductor device comprising: a semiconductor substrate in which circuit elements are integrated; a stationary electrode layer formed over the semiconductor substrate; a spacer formed around the stationary electrode layer over the semiconductor substrate, for attaching a vibrating diaphragm composing a capacitor together with the stationary electrode layer; a dummy island provided in the semiconductor substrate surrounding the stationary electrode layer; and means for applying fixed potential to the dummy island.

According to the second aspect of the invention, a semiconductor device defined as the first aspect of the invention, further comprising a shield metal for intercepting light, wherein the circuit element arranged around the stationary electrode layer, wherein the shield metal is formed so that the circuit element is covered, wherein the dummy island is arranged between the shield metal and the stationary electrode layer.

According to the third aspect of the invention, a semiconductor device defined as the first aspect of the invention, wherein the fixed potential is supply potential Vcc.

According to the fourth aspect of the invention, a semiconductor device comprising: a semiconductor substrate includes a one conductive type of semiconductor layer, a reverse conductive type of epitaxial layer formed on the semiconductor layer, and plural islands formed to separate the epitaxial layer by one conductive type of separated areas; a circuit element formed in the island; a stationary electrode layer formed over the semiconductor substrate; a spacer formed around the stationary electrode layer over the semiconductor substrate, for attaching a vibrating diaphragm composing a capacitor together with the stationary electrode layer; a dummy island separated by the separated area, which is provided in the semiconductor substrate surrounding the stationary electrode layer; and means for applying fixed potential to the dummy island.

According to the fifth aspect of the invention, a semiconductor device defined as the fourth aspect of the invention further comprising shield metal for intercepting light formed over the island having the circuit element.

According to the sixth aspect of the invention, a semiconductor device defined as the fifth aspect of the invention, wherein the shield metal further covers a part of the dummy island.

According to the seventh aspect of the invention, a semiconductor device defined as the fifth aspect of the invention, wherein the shield metal is separated from the stationary electrode layer in a horizontal direction by a clearance portion.

According to the eighth aspect of the invention, a semiconductor device defined as the seventh aspect of the invention, wherein the clearance portion is arranged above a part of the dummy island.

According to the ninth aspect of the invention, a semiconductor device defined as the fourth aspect of the invention, wherein the fixed potential is supply potential Vcc.

According to the tenth aspect of the invention, a semiconductor device defined as the fourth aspect of the invention, wherein a ground potential GND is applied to the semiconductor layer and the separated areas.

According to the eleventh aspect of the invention, a semiconductor device defined as the fourth aspect of the invention, wherein PN junction formed by the dummy island composes a dummy photodiode.

DETAILED DESCRIPTION OF THE PREFERRED EMBODIMENT

Figure 1:
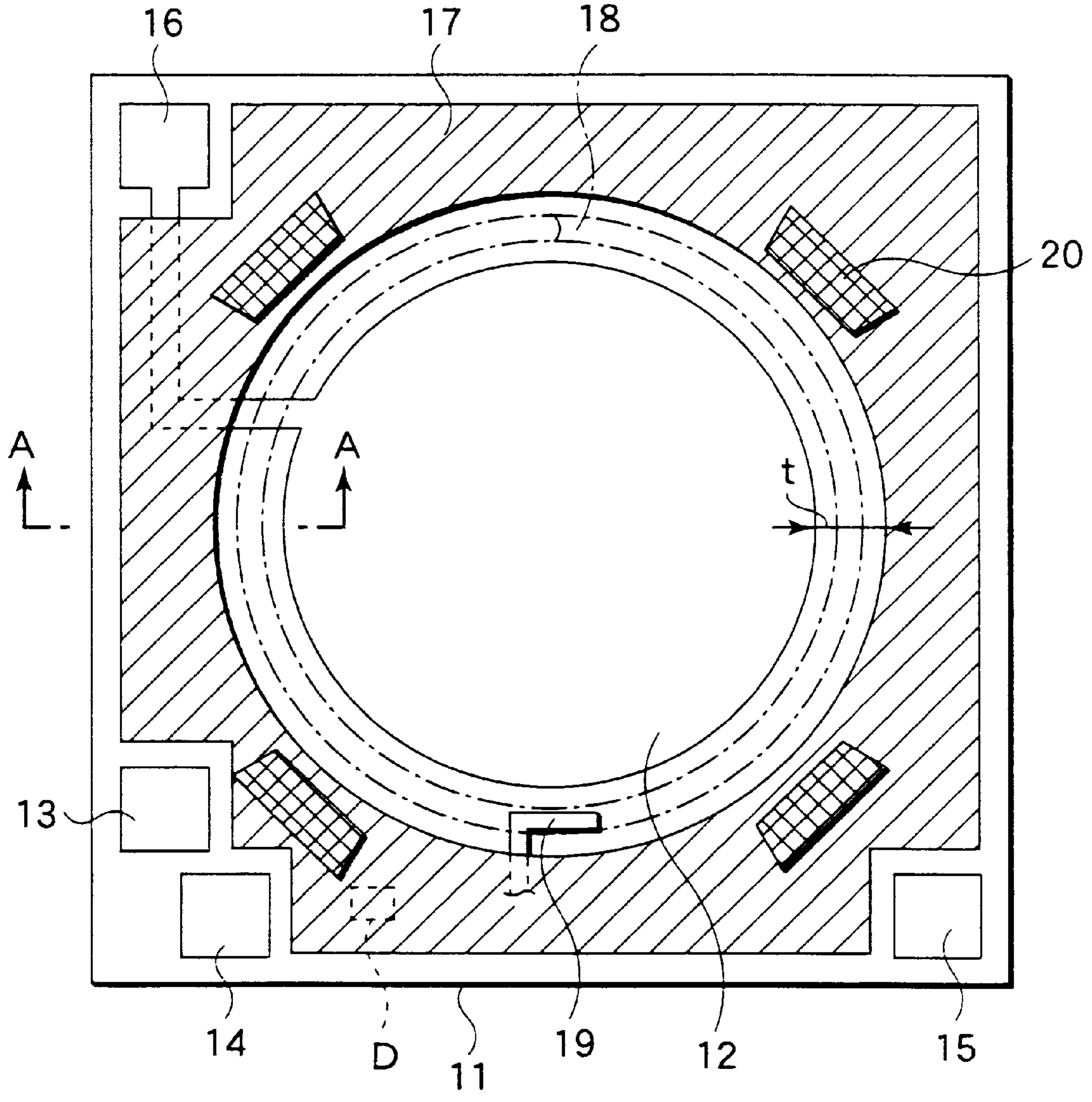
FIG. 1 is a plan for explaining a semiconductor device according to the invention.

Referring to the drawings, embodiments of the invention will be described in detail below.

FIG. 1 is a plan showing a semiconductor device according to the invention. A circular stationary electrode layer 12 approximately 1.3 mm in diameter is formed in substantially the center of a semiconductor substrate 11 approximately 2×2 $mm^2$ in size. A junction-type FET or MOSFET for impedance conversion D, a bipolar and/or MOS active device and a passive device such as a resistor are integrated on the surface of the semiconductor substrate 11 surrounding the stationary electrode layer 12 according to a normal semiconductor device manufacturing process, and an integrated network such as an amplifier and a noise canceling circuit is configured together with the FET D. Also, pad electrodes 13, 14, 15 and 16 for enabling input-output between these integrated circuits and an external circuit are arranged in the periphery of the semiconductor substrate 11. The size of adopted each pad electrode is approximately 0.12×0.12 $mm^2$. The pad electrode 16 is connected to the stationary electrode layer 12.

Shield metal 17 is provided over a place where the circuits are arranged. The shield metal 17 is not superimposed on the stationary electrode layer 12 and clearance t of approximately a few tens to a hundred $\mu$m is provided between both. Therefore, the shield metal 17 covers substantially the whole over the semiconductor substrate 11 except the stationary electrode layer 12 and the pad electrodes 13 to 16. The stationary electrode layer 12 and the shield metal 17 are made of wiring material having a property of shading such as Al or Al—Si.

A dummy island 18 is provided in the semiconductor substrate 11 in the vicinity of the end of the stationary electrode layer 12. The dummy island 18 surrounds the periphery of the stationary electrode layer 12 in a circle and is continuous or is separated into plural pieces. An electrode 19 is arranged on the surface of the dummy island 18 and applies fixed potential such as supply potential Vcc to the dummy island 18.

A spacer 20 is formed in two or more (for example, four) places over the semiconductor substrate 11 surrounding the stationary electrode layer 12. The spacer 20 is made of photosensitive resin such as polyimide and is patterned according to photolithographic technology. In this case, after baking, it is formed so that it has the thickness of approximately 13 $\mu$m.

Figure 2:
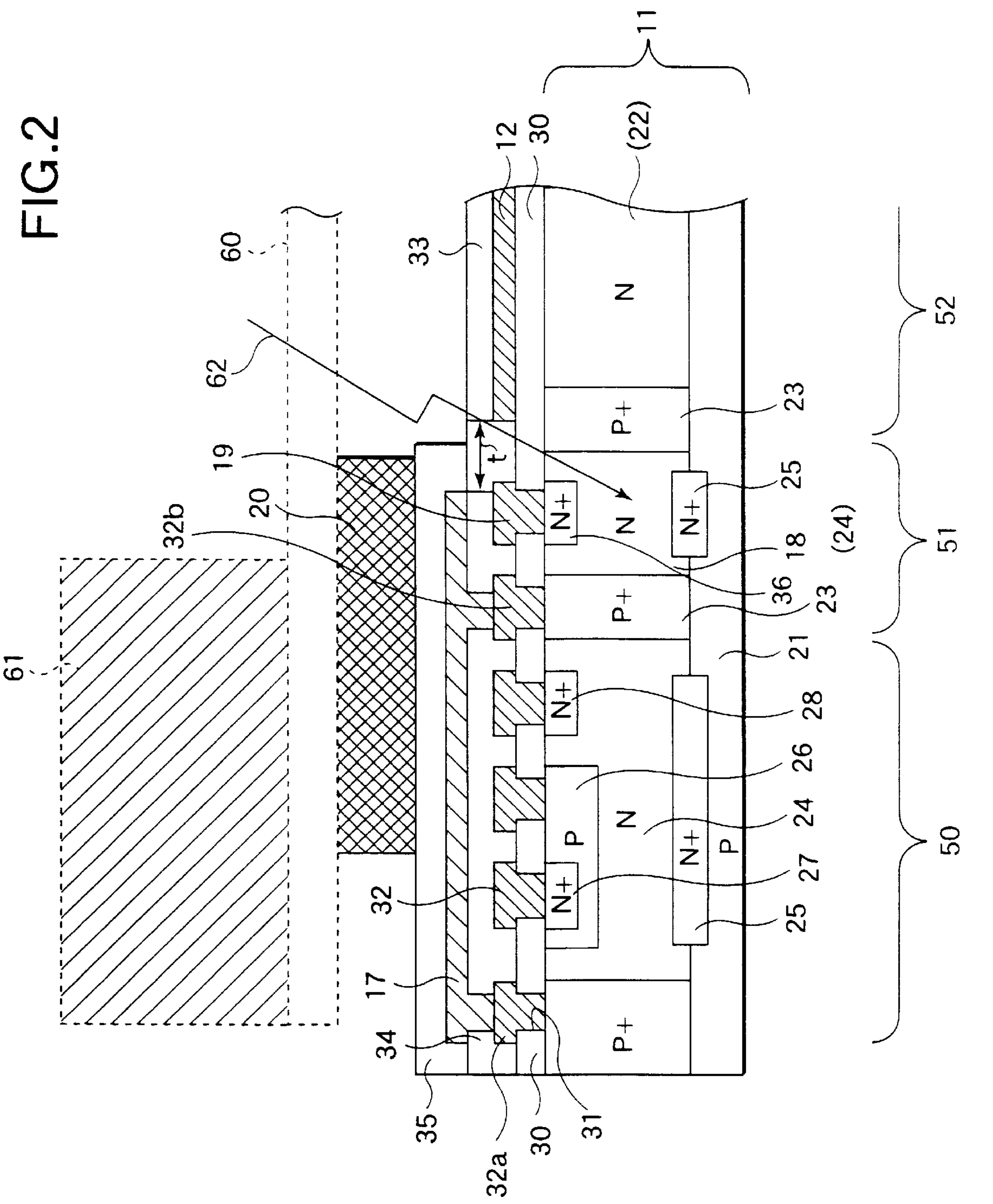
FIG. 2 is a sectional view viewed along a line A—A shown in FIG. 1.

FIG. 2 is a sectional view viewed along a line A—A in FIG. 1. The semiconductor substrate 11 is formed by forming an N-type epitaxial layer 22 on a P-type silicon semiconductor layer 21. The epitaxial layer 22 surrounded by separated areas 23 is electrically separated by forming the $P^+$-type separated area 23 reaching the semiconductor layer 21 from the surface of the epitaxial layer 22 to be an island 24. That is, the island 24 is surrounded by the separated areas 23. A reference number 25 denotes an $N^+$-type embedded layer embedded at the bottom of each island 24.

A circuit element is housed in each island 24 by forming a P-type or an N-type diffused area on the surface of the island 24. In this case, a P-type base area 26, an $N^+$-type emitter area 27 and an $N^+$-type collector contact area 28 for configuring an NPN transistor are shown. The surface of the epitaxial layer 22 is coated with a first insulating film 30 made of a silicon oxide film the thickness of which is 5000 to 10000 Å or others. A contact hole 31 in which the insulating film is removed and the surface of the diffused area is exposed is formed through the first insulating film 30.

First-layer electrode wiring 32 is formed on the first insulating film 30. The first-layer electrode wiring 32 comes in contact with the diffused area under the contact hole 31 via the contact hole 31, further, connects each circuit element by extending on the first insulating film 30. The first-layer electrode wiring 32, the stationary electrode layer 12 and the pad electrodes 13 to 16 are simultaneously formed such that electrode material, such as Al—Si, having the thickness of approximately 7000 Å is formed on the first insulating film 30 through which the contact holes 31 are formed, by sputtering or deposition and others, then patterning it according to normal photoetching technique so that it has a desired shape. The stationary electrode layer 12 is formed on the first insulating film 30 having even thickness.

A second insulating film 33 the thickness of which is approximately 4000 Å and which is made of $Si_3N_4$ or others is formed on the first-layer electrode wiring 32 and the stationary electrode layer 12. A through hole 34 is formed in a desired place of the second insulating film 33 and the surface of the first-layer electrode wiring 32 is exposed inside the through hole.

Shield metal 17 similarly made of electrode material such as an Al—Si is formed on the second insulating film 33. The shield metal 17 is connected to the first-layer electrode wiring 32*a* provided over the separated area around the island 24 via the through hole 34. As a result, the shield metal 17 and the first-layer electrode wiring 32*a* can cover each circuit element housed in the island 24. In case the first-layer electrode wiring 32*a* is connected to the separated area 23 under it via the contact hole 31, the shielding structure is more completed. However, it need scarcely be said that the first-layer electrode wiring 32*a* and the through hole 34 respectively on the separated area 23 are removed in a place where the first-layer electrode wiring 32 for electrically connecting the circuit elements is extended. Fixed potential such as ground potential GND is applied to the shield metal 17.

A passivation film 35 such as an insulating film made of polyimide or a film made of $Si_3N_4$ is formed on the shield metal 17. The passivation film 35 is removed over the pad electrodes 13 to 16 and the stationary electrode layer 12. The spacer 20 is formed on the passivation film 35.

The dummy island 18 is arranged in an area 51 between a circuit element area 50 in which the circuit elements are arranged and a stationary electrode layer area 52 in which the stationary electrode layer 12 is arranged. The structure is composed of the epitaxial layer 22 surrounded by the separated area 23 as the island 24. Fixed potential such as supply potential Vcc is applied to the dummy island 18 by electrode wiring 19 composed of the first-layer electrode wiring 32 via an $N^+$-type contact area 36. Ground potential GND for acquiring PN junction and junction isolation is applied to the P-type semiconductor layer 21 and the $P^+$-type separated area 23 and finally, PN junction between the dummy island 18 and these functions as a dummy photodiode. The shield metal 17 not only covers substantially the whole of the circuit element area 50 but can be extended up to over the dummy island 18, however, the shield metal is not superimposed on the stationary electrode layer 12. The reason is to prevent parasitic capacity from being caused by the superimposition of both.

In case the semiconductor device is integrated with the capacitor of a capacitor microphone, a vibrating diaphragm 60 that functions as a pair together with the stationary electrode layer 12 is attached on the spacer 20. In an actual manufacturing process, circuit elements, the stationary electrode layer 12, the passivation film 35, the spacer 20 and others are formed every semiconductor chip according to a normal semiconductor manufacturing process using a semiconductor wafer and after the semiconductor wafer is diced and an individual semiconductor chip is separated, each semiconductor chip is assembled by fixing the vibrating diaphragm 60 held to a frame 61 to the spacer.

The attached vibrating diaphragm 60 is a macromolecular film approximately 5 to 12.5 μm thick on one side for example (in this case, on the side of the stationary electrode layer 12) of which a thin film made of Ni, Al, Ti or others is formed and is made of macromolecular material such as FEP and PFA. Ground potential GND is applied to the vibrating diaphragm 60. The vibrating diaphragm 60 is a film the light transmittance of which is approximately a few to 10% and the interception of light of which is not complete.

Figure 3A:
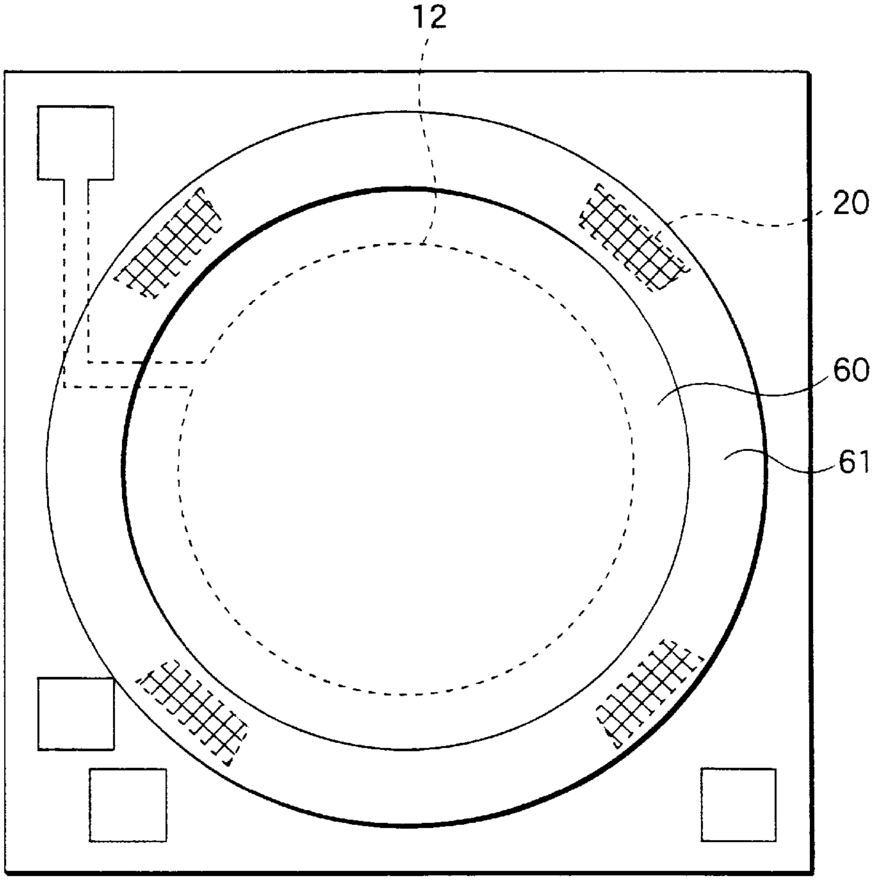
FIG. 3A is a plan and FIG. 3B is a sectional view respectively showing a state integrated with a capacitor.
Figure 3B:
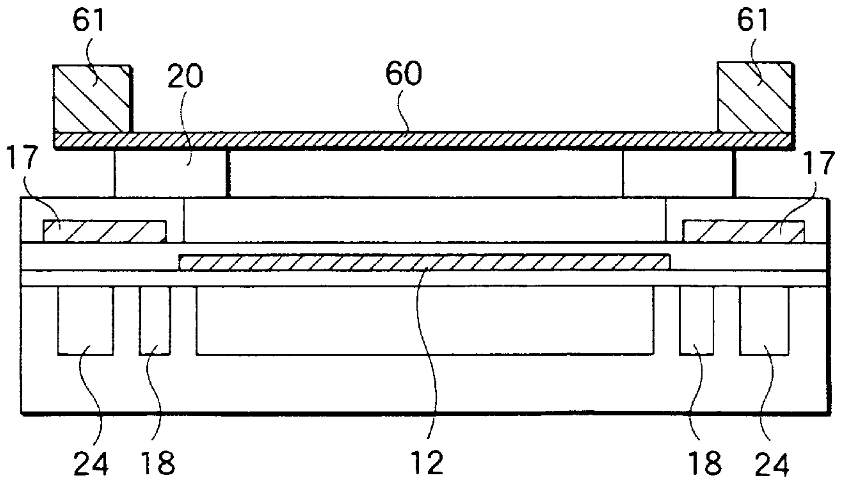

FIG. 3 are a plan and a sectional view respectively showing the semiconductor device in a state in which the vibrating diaphragm 60 is attached on the spacer 20. The circular vibrating diaphragm 60 approximately 1.8 mm in diameter is fixed to a circular frame 61 and is attached and fixed onto the spacer 20. The stationary electrode layer 12 and the vibrating diaphragm 60 are concentrically overlapped, are kept at a fixed interval (approximately 15 μm) by the spacer 20 and others, and both compose a capacitor. The capacitance value varies because aerial vibration vibrates the vibrating diaphragm 60 in this state and the variation is amplified by the FET D integrated in the semiconductor substrate 11. The stationary electrode layer 12 is connected to the input terminal of the FET D. The vibrating diaphragm 60 covers a part over the circuit element area 50.

Figure 4:
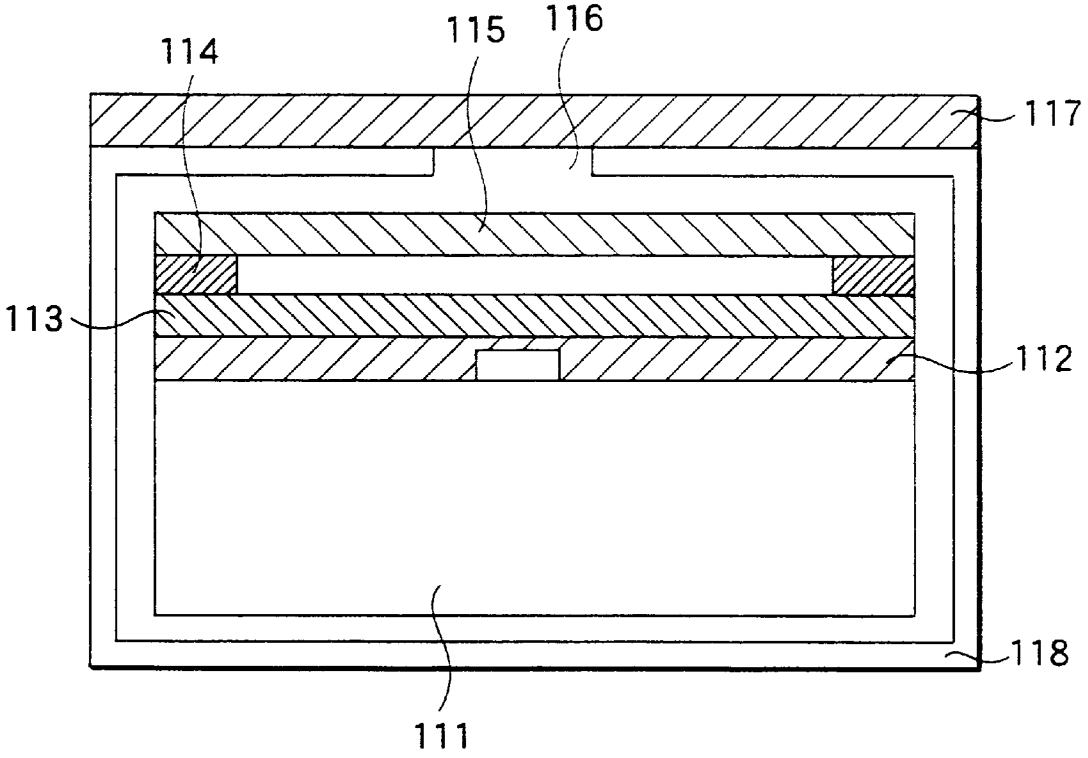
FIG. 4 is an explanatory drawing for explaining a conventional type semiconductor device.

The semiconductor substrate 11 over which the vibrating diaphragm 60 is attached is housed in a package having a hole for transmitting aerial vibration as the structure of the conventional type shown in FIG. 4. The electric connection to an external device is achieved by connecting metallic thin wire to the pad electrodes 13 to 16 formed over the semiconductor substrate 11.

As shown in FIG. 2, unnecessary light 62 which invades through the hole reaches the surface of the semiconductor substrate 11 housed in the package having the hole as described above through the vibrating diaphragm 60 or by irregular reflection from between the spacers 20. According to the structure according to the invention, as the circuit element area 50 covered with the shield metal 17 and the stationary electrode layer area 52 covered with the stationary electrode layer 12 are covered with light intercepting material, unnecessary light 62 never reaches the inside of the semiconductor substrate 11. The dummy island 18 is arranged in a place where unnecessary light 62 invades through an interval t between the shield metal 17 and the stationary electrode layer 12 and photoelectric current (an electron-hole pair) caused inside the dummy island 18 is absorbed in fixed potential Vcc by the electrode 19. Or the photoelectric current is absorbed in the first-layer electrode wiring 32$b$ via the separated area 23. Hereby, the photoelectric current is prevented from reaching the circuit element area 50 and the malfunction of the circuit element is prevented. It is desirable in view of the absorption of photoelectric current that the first-layer electrode wiring 32$b$ adjacent to the dummy island 18 is arranged so that the first-layer electrode wiring all surrounds the periphery of the stationary electrode layer 12.

Also, the shield metal 17 has not only a light intercepting function but an electric shield function that prevents capacity coupling between the vibrating diaphragm 60 in which charges are stored and each circuit element.

It need scarcely be said that for the material of the shield metal 17, material having a property of intercepting light or conductive material may be suitably selected. Also, if the through hole 34 and the contact hole 31 are both filled with material having a property of intercepting light and they surround the whole periphery of the circuit element area 50, the light intercepting function of the shield metal 17 is more completed.

Further, in the embodiment described above, two-layer structure composed of the first-layer electrode wiring 32 and the shield metal 17 is described, however, it need scarcely be said that the structure may be also three-layer or four-layer structure. In any case, the shield metal 17 is arranged on the uppermost layer.

As described above, the semiconductor device according to the invention has an advantage that as unnecessary light 62 can be prevented from invading into the electronic circuit by providing the shield metal 17, the malfunction by photoelectric current can be prevented.

Further, the semiconductor device according to the invention has an advantage that photoelectric current can be prevented from reaching the circuit element area 50 by providing the dummy island 18 in the corresponding place to prevent unnecessary light 62 from invading from clearance between the stationary electrode layer 12 and the shield metal 17 which cannot be overlapped and absorbing photoelectric current caused in the dummy island 18 in fixed potential, the malfunction can be prevented and the increase of noise can be prevented.

What is claimed is:

1. A semiconductor device comprising:

a semiconductor substrate in which circuit elements are integrated;

a stationary electrode layer formed over the semiconductor substrate;

a spacer formed around the stationary electrode layer over the semiconductor substrate, for attaching a vibrating diaphragm composing a capacitor together with the stationary electrode layer;

a dummy island provided in the semiconductor substrate between the stationary electrode layer and a region where the circuit elements are integrated;

means for applying a fixed potential to the dummy island; and a shield metal, for intercepting light, separated from the stationary electrode layer in a horizontal direction by a clearance portion.

2. A semiconductor device according to claim 1 wherein the circuit element is arranged around the stationary electrode layer; and wherein the shield metal is formed so that the circuit element is covered.

3. A semiconductor device according to claim 1, wherein the fixed potential is supply potential Vcc.

4. A semiconductor device comprising:

a semiconductor substrate includes a one conductive type of semiconductor layer and a reverse conductive type of epitaxial layer formed on the semiconductor layer;

a plurality of islands formed to separate the epitaxial layer by one conductive type of separated areas;

a circuit element formed in the island;

a stationary electrode layer formed over the semiconductor substrate;

a spacer formed around the stationary electrode layer over the semiconductor substrate, for attaching a vibrating diaphragm composing a capacitor together with the stationary electrode layer;

a dummy island separated by the separated areas, which is provided in the semiconductor substrate between the stationary electrode layer and a region where the circuit elements are integrated;

means for applying a fixed potential to the dummy island; and a shield metal, for intercepting light, separated from the stationary electrode layer in a horizontal direction by a clearance portion.

5. A semiconductor device according to claim 4 wherein the shield metal is formed over the island having the circuit element.

6. A semiconductor device according to claim 5, wherein the shield metal further covers a part of the dummy island.

7. A semiconductor device, comprising:

a semiconductor substrate includes a one conductive type of semiconductor layer and a reverse conductive type of epitaxial layer formed on the semiconductor layer;

a plurality of islands formed to separate the epitaxial layer by one conductive type of separated areas;

a circuit element formed in the island;

a stationary electrode layer formed over the semiconductor substrate;

a spacer formed around the stationary electrode layer over the semiconductor substrate, for attaching a vibrating diaphragm composing a capacitor together with the stationary electrode layer;

a dummy island separated by the separated areas, which is provided in the semiconductor substrate surrounding the stationary electrode layer;

means for applying a fixed potential to the dummy island; and a shield metal for intercepting light formed over the island having the circuit element wherein the shield metal is separated from the stationary electrode layer in a horizontal direction by a clearance portion.

8. A semiconductor device according to claim 7, wherein the clearance portion is arranged above a part of the dummy island.

9. A semiconductor device according to claim 4, wherein the fixed potential is supply potential Vcc.

10. A semiconductor device according to claim 4, wherein a ground potential GND is applied to the semiconductor layer and the separated areas.

11. A semiconductor device according to claim 4, wherein PN junction formed by the dummy island composes a dummy photodiode.

12. A semiconductor device, comprising:

a semiconductor substrate in which circuit elements are integrated;

a stationary electrode layer formed over the semiconductor substrate;

a spacer formed around the stationary electrode layer over the semiconductor substrate, for attaching a vibrating diaphragm composing a capacitor together with the stationary electrode layer;

a shield metal for intercepting light wherein the shield metal is formed so that the circuit element is covered.

13. The semiconductor device according to claim 12, further comprising:

a dummy island provided in the semiconductor substrate between the stationary electrode layer and a region where the circuit elements are integrated; and means for applying a fixed potential to the dummy island.

* * * * *

UNITED STATES PATENT AND TRADEMARK OFFICE
CERTIFICATE OF CORRECTION

PATENT NO. : 6,566,728 B1
DATED : May 20, 2003
INVENTOR(S) : Shigeaki Okawa et al.

It is certified that error appears in the above-identified patent and that said Letters Patent is hereby corrected as shown below:

Title page,
Item [73], please include the following Assignee that was inadvertently left out:

-- Hosiden Corporation, Osaka, Japan --

Signed and Sealed this

Twenty-third Day of December, 2003

JAMES E. ROGAN
*Director of the United States Patent and Trademark Office*